United States Patent
Wu et al.

(10) Patent No.: US 12,131,059 B2
(45) Date of Patent: Oct. 29, 2024

(54) DATA WRITING CIRCUIT, DATA WRITING METHOD, AND MEMORY

(71) Applicant: CHANGXIN MEMORY TECHNOLOGIES, INC., Hefei (CN)

(72) Inventors: Xianjun Wu, Hefei (CN); Weibing Shang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 320 days.

(21) Appl. No.: 17/855,848

(22) Filed: Jul. 1, 2022

(65) Prior Publication Data

US 2023/0280931 A1    Sep. 7, 2023

Related U.S. Application Data

(63) Continuation of application No. PCT/CN2022/088684, filed on Apr. 24, 2022.

(30) Foreign Application Priority Data

Mar. 3, 2022    (CN) .......................... 202210203725.5

(51) Int. Cl.
    *G06F 3/06*    (2006.01)
    *G11C 5/06*    (2006.01)

(52) U.S. Cl.
    CPC .......... *G06F 3/0655* (2013.01); *G06F 3/0604* (2013.01); *G06F 3/0679* (2013.01)

(58) Field of Classification Search
    None
    See application file for complete search history.

(56) References Cited

U.S. PATENT DOCUMENTS

| | | | | |
|---|---|---|---|---|
| 6,163,498 | A * | 12/2000 | Moon | G11C 8/00 |
| | | | | 365/194 |
| 7,577,047 | B2 * | 8/2009 | Jeong | G11C 7/22 |
| | | | | 365/194 |
| 9,697,885 | B1 | 7/2017 | Kim | |
| 10,419,246 | B2 | 9/2019 | Duan et al. | |
| 10,725,682 | B2 | 7/2020 | Kim et al. | |
| 2003/0026149 | A1 | 2/2003 | Braceras | |

(Continued)

FOREIGN PATENT DOCUMENTS

| | | |
|---|---|---|
| CN | 1959838 A | 5/2007 |
| CN | 101038785 A | 9/2007 |

(Continued)

*Primary Examiner* — Tan T. Nguyen
(74) *Attorney, Agent, or Firm* — Syncoda LLC; Feng Ma

(57) ABSTRACT

Disclosed are a data writing circuit, a data writing method, and a memory. The data writing circuit includes: a delay generation circuit, configured to generate a sub-grab signal of each storage area based on an initial grab signal and data transmission delay of each storage area, and generate a grab enable signal based on all of the sub-grab signals. A time interval between the time that each storage area receives data transmitted by a global data line and the time of receiving a column selection signal meets a preset range. A read-write control circuit writes data on a data bus into the global data line based on the grab enable signal. The global data line transmits the data to the storage area by using a column decoding circuit based on the column selection signal, so as to optimize tCCD of DRAM.

19 Claims, 8 Drawing Sheets

(56) References Cited

U.S. PATENT DOCUMENTS

| | | |
|---|---|---|
| 2003/0151966 A1 | 8/2003 | Demone |
| 2003/0202385 A1* | 10/2003 | Shin .................... G11C 11/4087 |
| | | 365/194 |
| 2004/0202036 A1 | 10/2004 | Demone |
| 2005/0180246 A1 | 8/2005 | Demone |
| 2006/0146641 A1 | 7/2006 | Demone |
| 2007/0070715 A1 | 3/2007 | Kim |
| 2009/0034347 A1 | 2/2009 | Demone |
| 2009/0063803 A1 | 3/2009 | Kim |
| 2010/0232237 A1 | 9/2010 | Demone |
| 2012/0008426 A1 | 1/2012 | Demone |
| 2014/0063977 A1* | 3/2014 | Park ........................ G11C 7/22 |
| | | 365/194 |
| 2018/0088864 A1 | 3/2018 | Ikarashi |
| 2020/0371869 A1 | 11/2020 | Park et al. |
| 2021/0407576 A1 | 12/2021 | Shang et al. |
| 2022/0122680 A1 | 4/2022 | Li |

FOREIGN PATENT DOCUMENTS

| | | | |
|---|---|---|---|
| CN | 102760487 | A | 10/2012 |
| CN | 103247334 | A | 8/2013 |
| CN | 107492392 | A | 12/2017 |
| CN | 109841240 | A | 6/2019 |
| CN | 111986727 | A | 11/2020 |
| CN | 112582013 | A | 3/2021 |
| CN | 109644020 | B | 7/2021 |
| CN | 113470711 | A | 10/2021 |
| CN | 113689899 | A | 11/2021 |
| TW | 201933107 | A | 8/2019 |
| WO | 2021164032 | A1 | 8/2021 |

\* cited by examiner

DATA WRITING CIRCUIT, DATA WRITING METHOD, AND MEMORY

CROSS-REFERENCE TO RELATED APPLICATIONS

This is a continuation application of International Patent Application No. PCT/CN2022/088684, filed on Apr. 24, 2022, which claims priority to Chinese Patent Application No. 202210203725.5, filed on Mar. 3, 2022. The disclosures of International Patent Application No. PCT/CN2022/088684 and Chinese Patent Application No. 202210203725.5 are hereby incorporated by reference in their entireties.

BACKGROUND

When a Dynamic Random Access Memory (DRAM) performs a write operation, a word line (WL) is activated first. Data required to be written is transmitted to a read-write control module RWCB of a target storage area via a transmission bus DQ. After the read-write control module RWCB grabs the data, the data is transmitted to a global data line YIO by using the transmission bus DQ, and is transmitted to corresponding storage arrays by using the global data line YIO. In the storage arrays, a column decoding module Ydec is driven to transmit the data on the global data line YIO to a local data line LIO by means of a column selection signal YS. Then, the data is transmitted to corresponding Bit Lines (BLs) by using the local data line LIO, so as to be written into corresponding storage units (which are selected by the WLs and the BLs).

Due to the position setting relationship between the column decoding module and the read-write control module and the high RC load of the column selection signal YS, the actual time taken for the column selection signal YS to work in different storage areas is different. For the case that transmission directions of the column selection signal YS and the global data line YIO in different storage areas are opposite, the column selection signal YS needs to be turned on after data transmission on the global data line YIO is completed. During a sequential write operation, transmission time on the global data line YIO of parts of the storage areas is long, but the column selection signal YS is turned on early; and transmission time on the global data line YIO of parts of the storage areas is short, but the column selection signal YS is turned on later. Therefore, the improvement of Cas to Cas delay (tCCD) of the DRAM is seriously limited.

For the case that transmission directions of the column selection signal YS and the global data line YIO in different storage areas are the same, during the sequential write operation, the transmission time on the global data line YIO of parts of the storage areas is long, the corresponding column selection signal YS is turned on late. However, due to the high RC load of the column selection signal YS, the actual time taken for the column selection signal YS to work in different storage areas may be different. If the time that the read-write control module RWCB grabs the data bus DQ is constant, there are still differences in the actual writing time of data in different storage areas, so that the tCCD of the DRAM is also limited, affecting the read-write speed of the DRAM.

SUMMARY

The disclosure relates, but is not limited to, a data writing circuit, a data writing method, and a memory.

An embodiment of the disclosure provides a data writing circuit, applicable to a memory. The memory includes a read-write control circuit, a column decoding circuit, and a plurality of storage areas. The data writing circuit includes a delay generation circuit. The delay generation circuit is configured to generate a sub-grab signal of each storage area based on an initial grab signal and data transmission delay of the storage area, and generate a grab enable signal based on all of the sub-grab signals. Data transmission delay corresponding to the storage area close to the column decoding circuit is less than data transmission delay corresponding to the storage area away from the column decoding circuit. A time interval between a time of receiving data transmitted by a global data line and a time of receiving a column selection signal by each storage area meets a preset range. The read-write control circuit is configured to write data on a data bus into the global data line based on the grab enable signal. The global data line is configured to transmit the data to the storage area through the column decoding circuit based on the column selection signal.

An embodiment of the disclosure further provides a data writing method, applicable to the data writing circuit mentioned above. The data writing method includes the following operations. An initial grab signal is provided. A sub-grab signal of each storage area is generated based on the initial grab signal and data transmission delay of the storage area, the data transmission delay is transmission delay of data on a global data line between the storage area and a read-write control circuit, to enable a time of receiving data transmitted by the global data line and a time of receiving a column selection signal by each storage area to meet a preset range. Data transmission delay corresponding to the storage area close to a column decoding circuit is less than data transmission delay corresponding to the storage area away from the column decoding circuit. A grab enable signal is generated based on all of the sub-grab signals. Data on a data bus is written into the global data line based on the grab enable signal. Data on the global data line is written into the respective storage areas corresponding to the sub-grab signals based on the column selection signal.

An embodiment of the disclosure further provides a memory, including a read-write control circuit, a plurality of storage areas and a column decoding circuit. Data is transmitted to a global data line by using the data writing circuit mentioned above. Each storage area is connected to the global data line. Based on a column selection signal, the data transmitted on the global data line is received and stored by the column decoding circuit.

BRIEF DESCRIPTION OF THE DRAWINGS

One or more embodiments are exemplified by the figures in the corresponding drawings, and these exemplary descriptions do not constitute limitations of the embodiments. Unless otherwise stated, the figures in the drawings do not constitute a scale limitation. In order to illustrate the technical solutions in the embodiments of the disclosure or conventional technologies more clearly, the drawings used in the embodiments will be briefly described below. It is apparent that the drawings in the following descriptions are merely some embodiments of the disclosure. Other drawings can be obtained from those skilled in the art according to these drawings without any creative work.

DETAILED DESCRIPTION

Due to the position setting relationship between the column decoding circuit and the read-write control circuit, when transmission directions of the column selection signal YS and the global data line YIO in different storage areas are opposite, the column selection signal YS needs to be turned on after data transmission on the global data line YIO is completed. During a sequential write operation, transmission time on the global data line YIO of parts of the storage areas is long, but the column selection signal YS is turned on earliest; and transmission time on the global data line YIO of parts of the storage areas is short, but the column selection signal YS is turned on at the latest. Therefore, the improvement of tCCD (which is a time interval between CAS commands, CAS being short for Column Address Strobe) of the DRAM is seriously limited.

When transmission directions of the column selection signal YS and the global data line YIO in different storage areas are the same, during the sequential write operation, transmission time on the global data line YIO of parts of the storage areas is long, the corresponding column selection signal YS is turned on late. However, due to the high RC load of the column selection signal YS, the actual time taken for the column selection signal YS to work in different storage areas may be different. If the time that the read-write control circuit RWCB grabs the data bus DQ is constant, there are still differences in the actual writing time of data in different storage areas, so that the tCCD of the DRAM is also limited, affecting the read-write speed of the DRAM.

An embodiment of the disclosure provides a data writing circuit, to unify time intervals between time of receiving the column selection signals YS and time of receiving data transmitted by the global data line YIO for different storage areas, thereby optimizing the tCCD of the DRAM.

Figure 1:
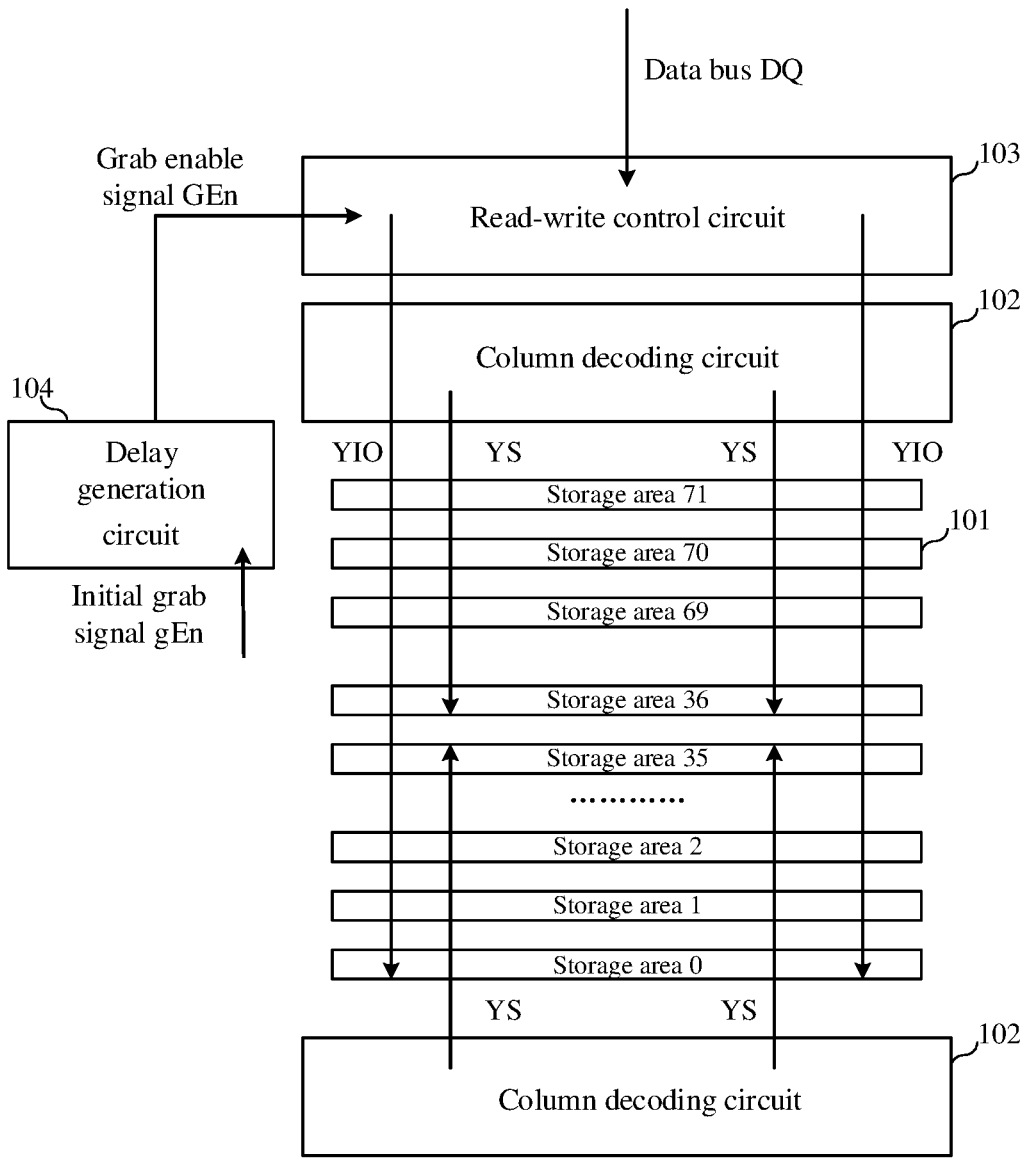
FIG. 1 is a schematic diagram of a part of the structure of DRAM for data storage according to an embodiment of the disclosure.

Referring to FIG. 1, for the arrangement of part of the DRAM, since the process cannot reduce the capacitance of the BLs, it is necessary to increase the read-write rate of the DRAM by driving the column selection signal YS at both ends. In this case, transmission directions of the column selection signals YS and the global data line YIO in parts of the storage areas are the same. For example, taking a data bank of the DRAM is divided into 72 storage areas as an example, the column selection signals YS in the storage area 36 to the storage area 71 have the same transmission direction as the global data line YIO, so that the tCCD of this parts of the storage areas is easy to control. The column selection signals YS in parts of the storage areas have the transmission direction opposite to that of the global data line YIO, for example, the storage area 0 to the storage area 35, which also has the above problems.

In this embodiment, based on the storage area 0 to the storage area 35, the tCCD of the storage areas where the column selection signals YS have the opposite transmission direction to the global data line YIO is optimized are described in detail with reference to the structure shown in FIG. 1, which does not constitute a limitation to this embodiment. Likewise, the optimization is also applicable to the storage area 36 to the storage area 71. In other embodiments, if the DRAM is not set to a manner of driving the column selection signal YS at both ends, features mentioned in this embodiment are still applicable to the storage areas in the DRAM.

It is to be understood by those skilled in the art that, in each embodiment of the disclosure, many technical details are provided to better understand the disclosure. However, even without these technical details and various changes and modifications based on the following embodiments, the technical solutions claimed in the disclosure may also be realized. The following divisions of the embodiments are for ease of description, and should not constitute any limitation to the specific implementations of the disclosure. The embodiments may be combined with each other and referred to each other without contradiction.

Figure 2:
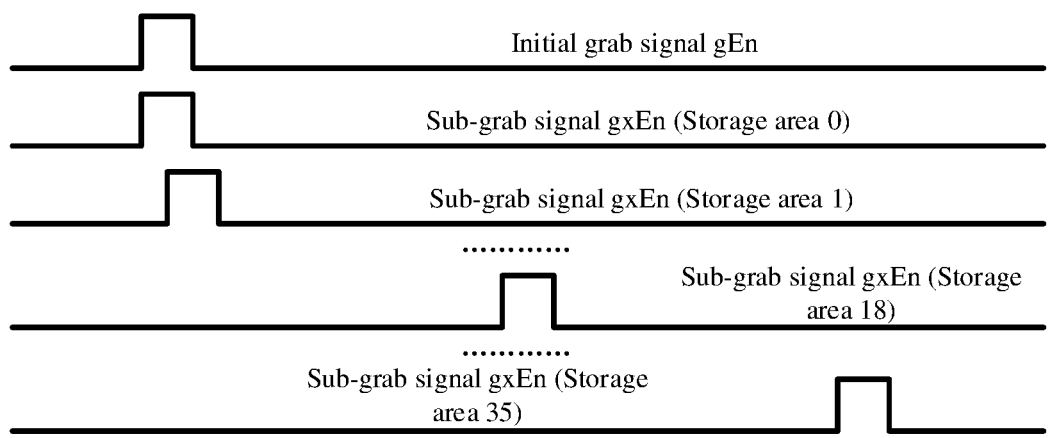
FIG. 2 is a schematic timing-sequence diagram of an initial grab signal and a sub-grab signal according to an embodiment of the disclosure.
Figure 3:
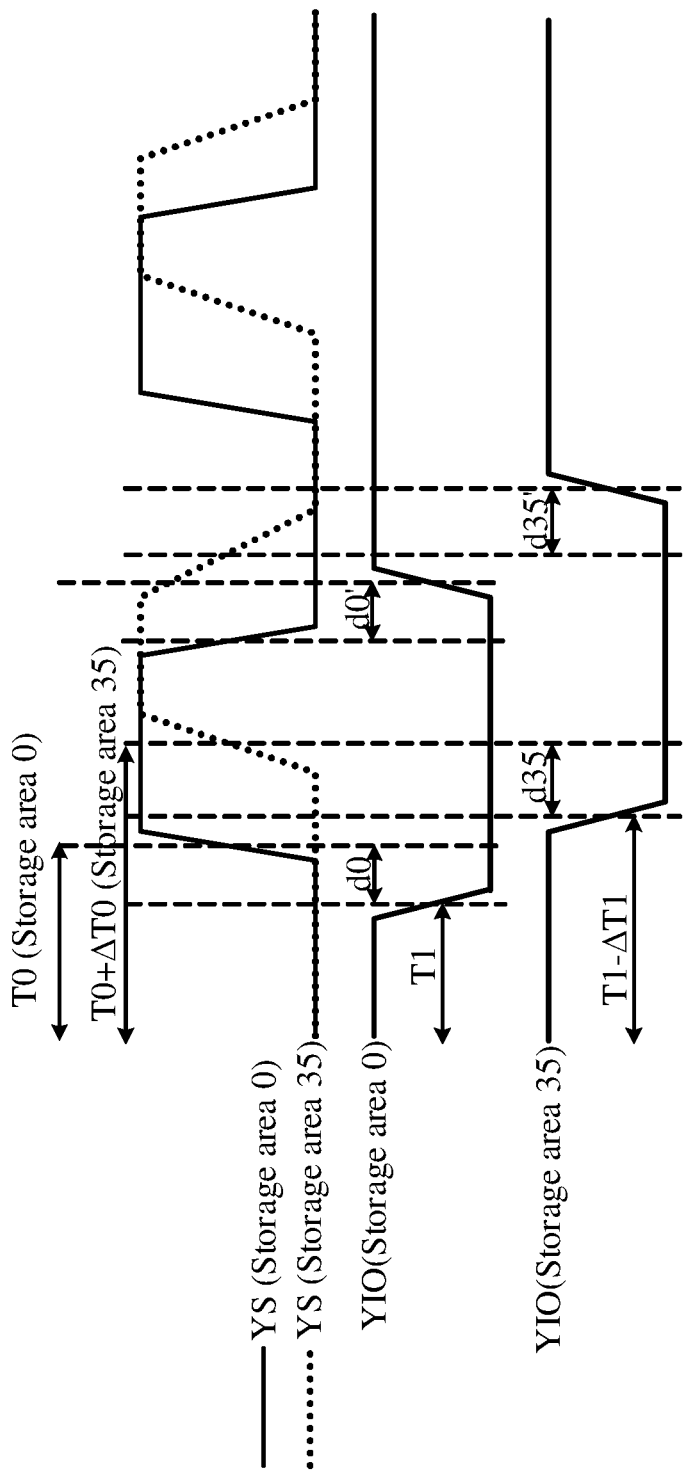
FIG. 3 is a signal writing timing sequence of a data writing circuit for different storage areas according to an embodiment of the disclosure.
Figure 4:
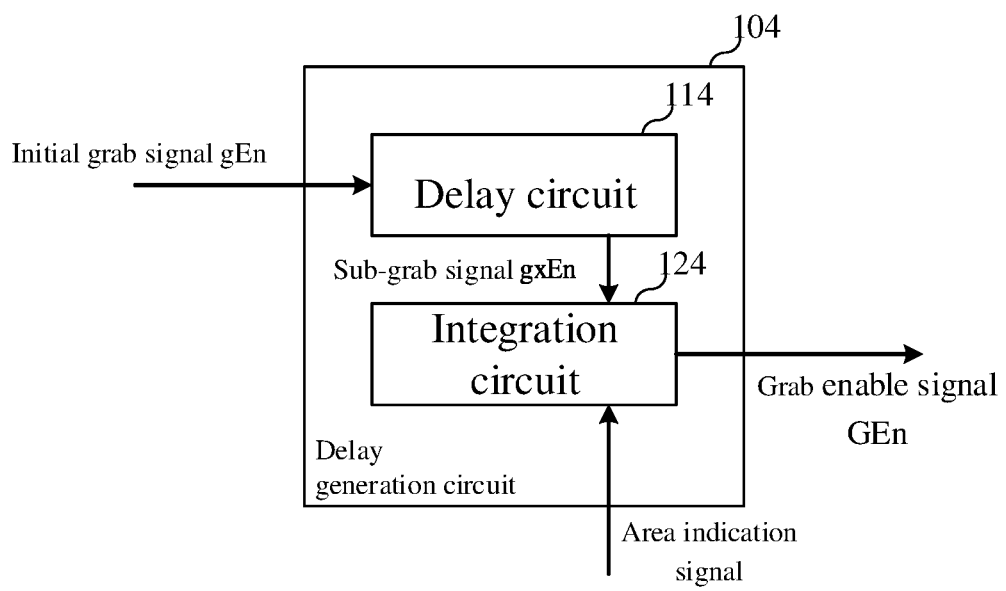
FIG. 4 is a schematic structural diagram of a delay generation circuit according to an embodiment of the disclosure.
Figure 5:
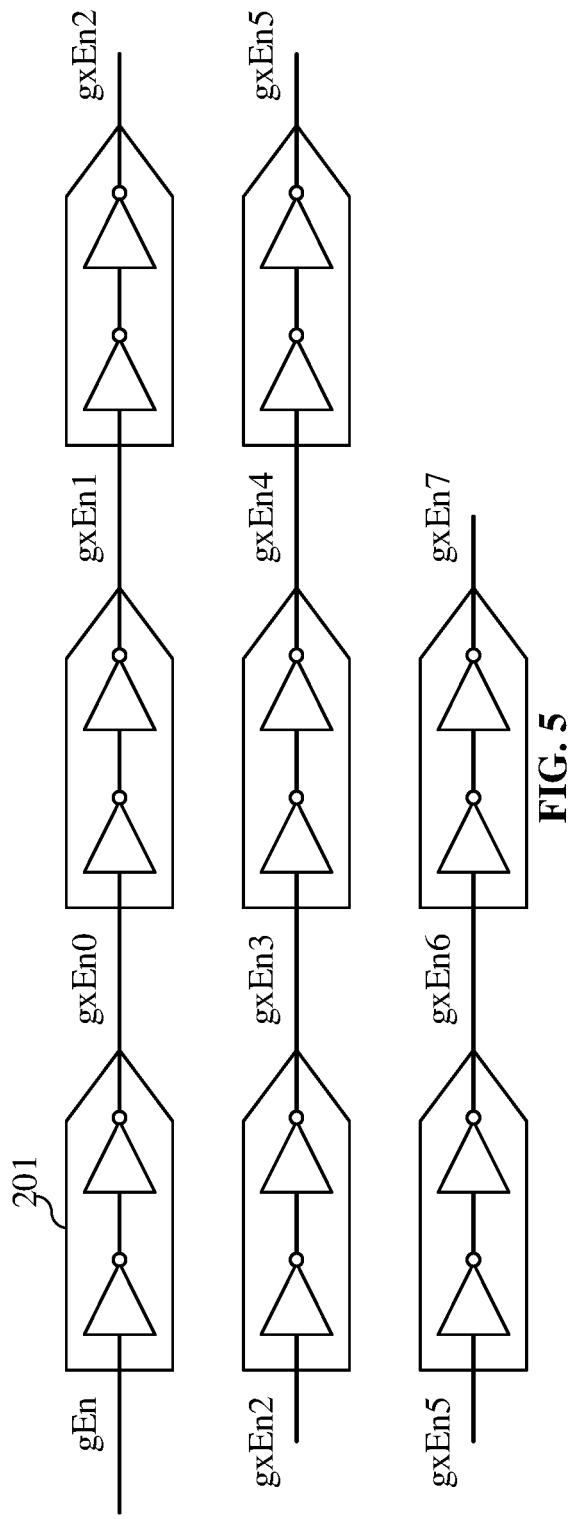
FIG. 5 is a schematic structural diagram of a delay circuit according to an embodiment of the disclosure.
Figure 6:
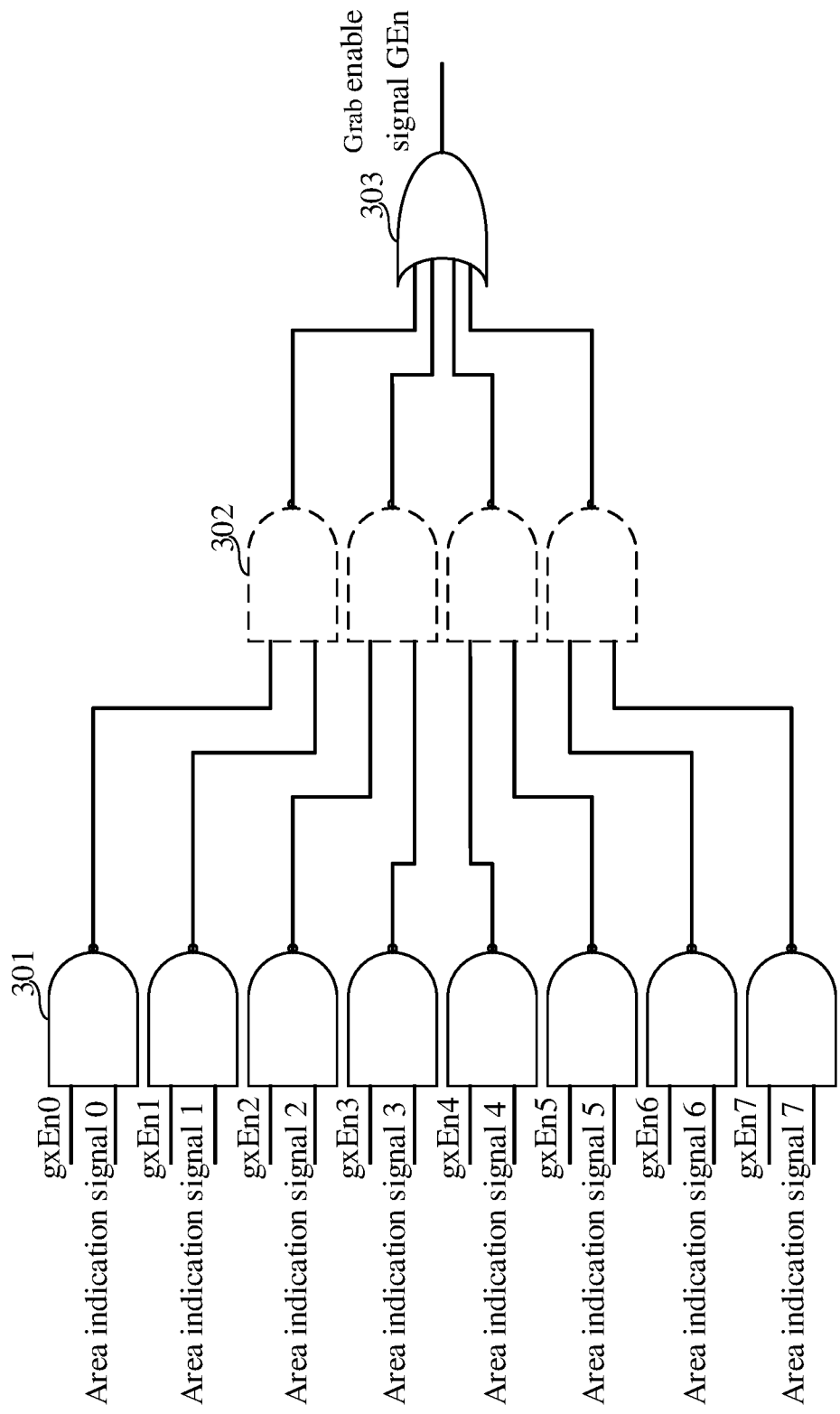
FIG. 6 is a schematic structural diagram of an integration circuit according to an embodiment of the disclosure.
Figure 7:
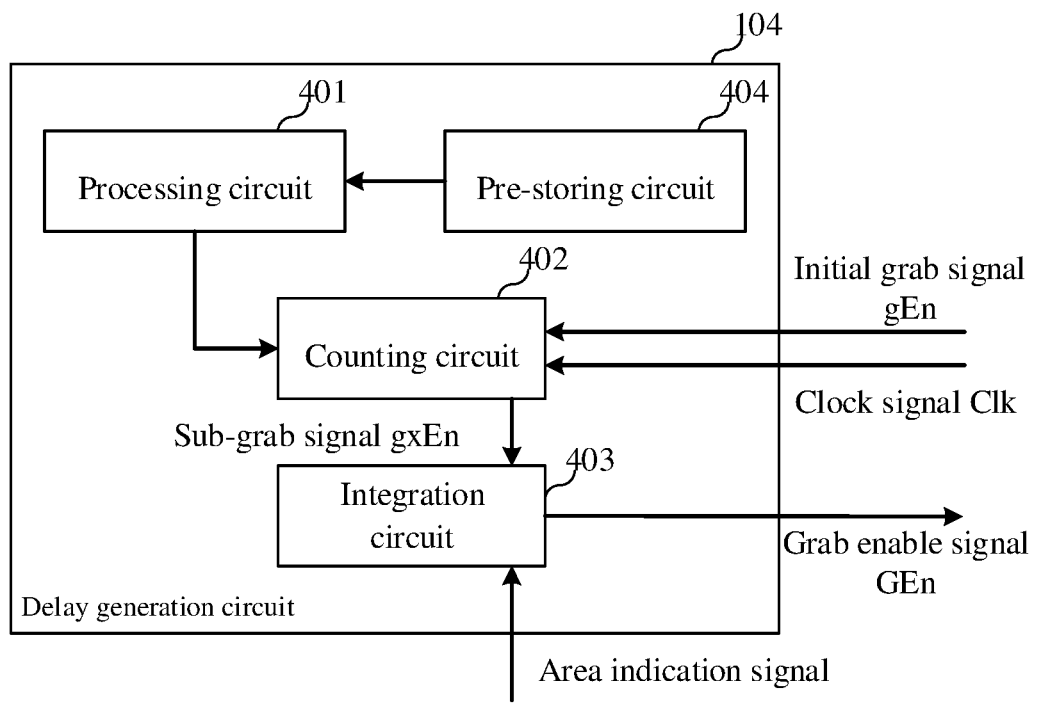
FIG. 7 is a schematic structural diagram of a delay generation circuit according to another embodiment of the disclosure.

FIG. 1 is a schematic diagram of a part of the structure of DRAM for data storage according to an embodiment. FIG. 2 is a schematic timing-sequence diagram of an initial grab signal and a sub-grab signal according to an embodiment. FIG. 3 is a signal writing timing sequence of a data writing circuit for different storage areas according to an embodiment. FIG. 4 and FIG. 7 are schematic structural diagrams of a delay generation circuit according to an embodiment. FIG. 5 is a schematic structural diagram of a delay circuit according to an embodiment. FIG. 6 is a schematic structural diagram of an integration circuit according to an embodiment. The data writing circuit provided in the embodiments is further described in detail below with reference to the drawings. Details are shown as follows.

Referring to FIG. 1, the data writing circuit is applicable to a memory, and the memory includes a column decoding circuit 102 and a plurality of storage areas 101. The data writing circuit includes a delay generation circuit 104.

The delay generation circuit 104 is configured to generate a sub-grab signal gxEn of each storage area 101 based on an initial grab signal gEn and data transmission delay of each storage area 101, and generate a grab enable signal GEn based on all sub-grab signals gxEn.

The data transmission delay corresponding to the storage area close to the column decoding circuit 102 is less than the data transmission delay corresponding to the storage area away from the column decoding circuit 102. That is, the data transmission delay corresponding to the storage area close to a read-write control circuit 103 is less than the data transmission delay corresponding to the storage area away from the read-write control circuit 103.

Specifically, for the circuit shown in FIG. 1 and the storage areas 0 to 35, a distance between the storage area 0 and the read-write control circuit 103 is relatively far, and in this case, the time that data is transmitted, by the read-write control circuit 103, to the storage area 0 via the global data line YIO is relatively long, that is, the data transmission delay of the storage area 0 is large; and a distance between the storage area 35 and the read-write control circuit 103 is relatively close, and in this case, the time that data is transmitted, by the read-write control circuit 103, to the storage area 35 via the global data line YIO is relatively short, that is, the data transmission delay of the storage area 35 is small. For the storage areas 36 to 71, a distance between the storage area 71 and the read-write control circuit 103 is relatively close, and in this case, the time that data is transmitted, by the read-write control circuit 103, to the storage area 71 via the global data line YIO is relatively short, that is, the data transmission delay of the storage area 71 is small; and a distance between the storage area 36 and the read-write control circuit 103 is relatively far, and in this case, the time that data is transmitted, by the read-write control circuit 103, to the storage area 36 via the global data line YIO is relatively long, that is, the data transmission delay of the storage area 36 is large.

A time interval between the time of receiving data transmitted by the global data line YIO and the time of receiving the column selection signal YS for each storage area 101 meets a preset range.

In some embodiments, a value of the data transmission delay is greater than or equal to transmission delay of data on the global data line YIO between the storage area 101 and the read-write control circuit 103.

Further, in some embodiments, the value of the data transmission delay is equal to the transmission delay of data on the global data line YIO between the storage area 101 and the read-write control circuit 103.

For the storage areas 0 to 35, it may be learned from FIG. 1 that, for the column selection signal YS sent by the column decoding circuit 102, the time that the storage area close to the column decoding circuit 102 receives the column selection signal YS is prior to the time that the storage area away from the column decoding circuit 102 receives the column selection signal YS. Referring to FIG. 1, assuming that the column selection signal YS is provided at time T, the storage area 0 receives the column selection signal YS at time T0, and time delay that the storage areas 1 to 35 receive the column selection signal YS is T0+ΔT0 (for different storage areas 101, ΔT0 is different).

It may be learned from the above, the data transmission delay corresponding to the storage area close to the column decoding circuit 102 is less than the data transmission delay corresponding to the storage area away from the column decoding circuit 102. Referring to FIG. 1, assuming that the read-write control circuit 103 grabs the data at time 0, the storage area 0 receives the data on the global data line YIO at time T1, and the time delay that the storage areas 1 to 35 receive the data on the global data line YIO is T1−ΔT1 (for different storage areas 101, ΔT1 is different).

Ideally (there are no delay of the column selection signal YS and no data transmission delay of the global data line), the time interval between the time that the storage area receives the data on the global data line YIO and the time that the storage area receives the column selection signal YS is T. However, actually, the time interval between the time that the storage area receives the data of the global data line YIO and the time that the storage area receives the column selection signal YS is (T0+ΔT0)−(T1−ΔT1). The data to be written into each storage area is adjusted by generating the sub-grab signal gxEn of each storage area 101 according to the initial grab signal gEn, and the data is grabbed by the read-write control circuit 103 at different moments, so as to achieve the uniformity of the time intervals between the time of receiving the data on the global data line YIO and the time of receiving the column selection signal YS by different storage areas, so that the time interval between the time of receiving data transmitted by the global data line YIO and the time of receiving the column selection signal YS for each storage area 101 meets the preset range. The sub-grab signal gxEn of each storage area 101 is generated according to the initial grab signal gEn, to adjust the time that the read-write control circuit 103 grabs the data to be written into each storage area, so as to achieve the uniformity of the time interval between end time of the column selection signal YS received by different storage areas and the time of next starting of data transmission on the global data line YIO, so that the time interval between end time of the column selection signal YS of each storage area 101 and the time of next starting of data transmission of the global data line YIO meets the preset range.

Specifically, referring to FIG. 2, the storage area 101 close to the column decoding circuit 102, for example, the storage area 0, may rapidly receive the column selection signal YS, that is, T0+ΔT0 is relatively small. For the storage area 101, it is required to slowly receive the data on the global data line YIO, that is, T1−ΔT1 is relatively large. In this case, the time interval between the time that the storage area 101 receives the data on the global data line YIO and the time that the storage area 101 receives the column selection signal YS is small, that is, (T0+ΔT0)−(T1−ΔT1) is small. When a YS instruction ends, it is required to wait for a long time to start next data transmission of the global data line YIO. Referring to FIG. 3, for the storage area 0, the time that the storage area 101 receives the data on the global data line YIO is shortened by controlling the read-write control circuit 103 to grab data in advance, that is, T1−ΔT1 is reduced, so that the time interval d0 between the time that the storage area 101 receives the data of the global data line YIO and the time that the storage area 101 receives the column selection signal YS meets the preset range. The time of next data transmission of the global data line YIO is advanced by controlling the read-write control circuit 103 to start grabing the data in advance, so that the time interval d0' between end time of the column selection signal YS and the time of next starting of data transmission on the global data line YIO meets the preset range. When a write operation is switched to a read operation, the global data line YIO connected to the storage area 101 away from the read-write control circuit 103 can be charged to a high potential by performing equalization operation in advance, so as to solve a problem that the far-end YIO cannot be completely charged to the high potential with the limitation of Write to Read delay (tWTR).

In an embodiment, a difference value between the time interval d0 between the time of receiving the data of the global data line YIO and the time of receiving the column selection signal YS by the storage area 0 and the time interval d0' between the end time of the column selection signal YS and the time of next starting of data transmission on the global data line YIO is greater than or equal to zero, and is less than or equal to a preset threshold. For example, |d0−d0'| is less than or equal to 10 picoseconds. Therefore, the tCCD is enhanced by shortening the delay due to a structural layout of the memory.

Continuously referring to FIG. 2, the storage area 101 away from the column decoding circuit 102, for example, the storage area 35, needs to slowly receive the column selection signal YS, that is, T0+ΔT0 is relatively large. The storage area 101 may rapidly receive the data of the global data line YIO, that is, T1−ΔT1 is relatively small. In this case, the time interval between the time that the storage area 101 receives the data of the global data line YIO and the time that the storage area 101 receives the column selection signal YS is large, that is, (T0+ΔT0)−(T1−ΔT1) is large. When the YS instruction ends, the time of starting next data transmission on the global data line YIO is relatively short. Referring to FIG. 3, for the storage area 35, the time that the storage area 101 receives the data on the global data line YIO is delayed by performing delay control on the read-write control circuit 103 to grab data, that is, T1−ΔT1 is increased, so that the time interval d35 between the time that the storage area 101 receives the data on the global data line YIO and the time that the storage area 101 receives the column selection signal YS meets the preset range. The time of next data transmission on the global data line YIO is delayed by controlling the read-write control circuit 103 to delay the grab of the data, so that the time interval d35′ between end time of the column selection signal YS and the time of next starting of data transmission on the global data line YIO meets the preset range.

In an embodiment, a difference value between the time interval d35 between the time that the storage area 35 receives the data of the global data line YIO and the time that the storage area 35 receives the column selection signal YS and the time interval d35′ between the end time of the column selection signal YS and the time of next starting of data transmission on the global data line YIO is greater than or equal to zero, and is less than or equal to a preset threshold. For example, |d35−d35| is less than or equal to 10 picoseconds. Therefore, the tCCD is enhanced by means of the delay due to the structural layout of the memory.

For the storage areas 36 to 71, based on the discussion mentioned above, the time delay that the storage area 36 to the storage area 71 receive the column selection signal YS is T0+ΔT0 (for different storage areas 101, ΔT0 is different), and the delay that the data of the storage area 36 to the storage area 71 is transmitted to the read-write control circuit 103 by using the global data line is T1−ΔT1 (for different storage areas 101, ΔT1 is different).

The storage area 101 close to the column decoding circuit 102 may rapidly receive the data of the global data line YIO, that is, T1−ΔT1 is relatively small; and the storage area 101 may rapidly receive the column selection signal YS, that is, T0+ΔT0 is relatively small. The storage area 101 away from the column decoding circuit 102 needs to slowly receive the data of the global data line YIO, that is, T1−ΔT1 is relatively large; and the storage area 101 needs to slowly receive the column selection signal YS, that is, T0+ΔT0 is relatively large. However, due to the high RC load of the column selection signal YS, there is still a difference in the time interval (T0+ΔT0)−(T1−ΔT1) for data writing when different storage areas 101 receive the data of the global data line YIO, and if T0+ΔT0 is larger, (T0+ΔT0)−(T1−ΔT1) is larger. That is, for the storage area 101 away from the column decoding circuit 102, it is required to perform delay control on the read-write control circuit 103 to grab data, so that the time that the storage area 101 receives the data of the global data line YIO is prolonged.

Each sub-grab signal gxEn is used for configuring the corresponding storage area 101 to complete data writing. If the data is continuously written, that is, according to the storage area required to be written, the active level in the corresponding sub-grab signal gxEn is integrated on a same signal, to generate the grab enable signal GEn. The grab enable signal GEn is configured to instruct the corresponding storage area to complete continuous data writing.

The read-write control circuit 103 is configured to write the data on a data bus DQ into the global data line YIO based on the grab enable signal GEn.

The global data line YIO is configured to transmit the data to the storage area 101 through the column decoding circuit 102 based on the column selection signal YS.

In some embodiments, in order to further optimize the tCCD of the DRAM, the time interval between the time of receiving data transmitted by the global data line YIO and the time of receiving the column selection signal YS for each storage area 101 is the same.

In some embodiments, referring to FIG. 4, the delay generation circuit 104 includes a delay circuit 114 and an integration circuit 124.

The delay circuit 114 is configured to generate the sub-grab signal gxEn corresponding to each storage area 101.

The integration circuit 124 is configured to generate the grab enable signal GEn based on the sub-grab signal gxEn corresponding to the storage area 101 to which a WL in an on-state belongs.

In an example, the delay circuit 114 includes a plurality of delay subcircuits 201. The plurality of delay subcircuits 201 are in series connection with each other. In the plurality of delay subcircuits 201 connected in series, an input end of the first-stage delay subcircuit 201 is configured to receive the initial grab signal gEn. A connection line between the two adjacent delay subcircuits 201 and an output end of the last-stage delay subcircuit 201 are configured to output the sub-grab signals corresponding to different storage areas. Different sub-grab signals gxEn have different data transmission delay.

Referring to FIG. 5, the first-stage delay subcircuit 201 is configured to receive the initial grab signal gEn, and generate the sub-grab signal gxEn0. The second-stage delay subcircuit 201 is configured to receive the sub-grab signal gxEn0, and generate the sub-grab signal gxEn1. The third-stage delay subcircuit 201 is configured to receive the sub-grab signal gxEn1, and generate the sub-grab signal gxEn2. The fourth-stage delay subcircuit 201 is configured to receive the sub-grab signal gxEn2, and generate the sub-grab signal gxEn3. The fifth-stage delay subcircuit 201 is configured to receive the sub-grab signal gxEn3, and generate the sub-grab signal gxEn4. The sixth-stage delay subcircuit 201 is configured to receive the sub-grab signal gxEn4, and generate the sub-grab signal gxEn5. The seventh-stage delay subcircuit 201 is configured to receive the sub-grab signal gxEn5, and generate the sub-grab signal gxEn6. The eighth-stage delay subcircuit 201 is configured to receive the sub-grab signal gxEn6, and generate the sub-grab signal gxEn7.

For a circuit shown in FIG. 1, each sub-grab signal gxEn is used for data writing of four storage areas 101. That is, the sub-grab signal gxEn0 is used for data storage of the storage area 0 to the storage area 3; the sub-grab signal gxEn1 is used for data storage of the storage area 4 to the storage area 7; the sub-grab signal gxEn2 is used for data storage of the storage area 8 to the storage area 11; the sub-grab signal gxEn3 is used for data storage of the storage area 12 to the storage area 15; and so on. It is to be noted that, in other embodiments, each sub-grab signal may be used for data writing of any storage area. There is less number of the applied storage areas, the control of data writing of the storage areas is more accurate; and there are more applied storage areas, consumption when the data of the memory is written may be reduced.

In some embodiments, an even number of inverters are arranged in each delay subcircuit 201, and the number of the inverters in parts of the delay subcircuits 201 is different. That is to say, different delay subcircuits are configured to generate different data delay. In some other embodiments, the even number of inverters is arranged in each delay subcircuit 201, and the number of the inverters in parts of the delay subcircuits 201 is the same. That is to say, each delay subcircuit is configured to generate the same data delay.

In some embodiments, referring to FIG. 6, the integration circuit 124 includes a plurality of primary NAND gates 301.

Each of the plurality of primary NAND gates 301 corresponds to at least one storage area. One input end of the NAND gate 301 is configured to receive an area indication signal of the corresponding storage area 101, and the other input end is configured to receive the sub-grab signal of the corresponding storage area.

The area indication signal is configured to represent the storage area 101 to which the WL in the on-state belongs.

Output ends of the plurality of primary NAND gates 301 are connected to a same output OR gate 303, and the output OR gate 303 is configured to output the grab enable signal GEn.

The grab enable signal GEn is acquired by integrating active levels in the plurality of active sub-grab signals gxEn in the same active level, so that the plurality of selected storage areas 101 are driven based on the grab enable signal GEn, so as to achieve continuous read and write of different storage areas 101.

It is to be noted that, in FIG. 6, 8 primary NAND gates 301 are used as an example for detailed description, i.e., 4 storage areas 101 share one primary NAND gate 301, and limitations are not constituted to this embodiment. In other embodiments, one primary NAND gate 301 may also correspond to any number of the storage areas 101 for specific arrangement.

In some embodiments, the integration circuit 124 further includes a plurality of secondary NAND gates 302.

The number of the secondary NAND gates 302 is less than the number of the primary NAND gates 301, and each secondary NAND gate 302 is connected to at least two primary NAND gates 301.

The case that output ends of the plurality of primary NAND gates are connected to the same output OR gate 303, and the output OR gate 303 is configured to output the grab enable signal GEn includes: output ends of the plurality of secondary NAND gates 302 are connected to the same output OR gate 303.

An AND operation is performed on the sub-grab signals gxEn of the plurality of primary NAND gates by means of the secondary NAND gates to obtain a new enable signal, so as to simultaneously drive the plurality of storage areas. In some embodiments, the sub-grab signals gxEn may also be directly arranged to correspondingly drive an equal number of storage areas 101.

In some embodiments, referring to FIG. 7, the delay generation circuit 104 includes a processing circuit 401, a counting circuit 402, and an integration circuit 403.

The processing circuit 401 is configured to acquire a storage area 101 to which an active WL address belongs according to the active WL address, and acquire a preset value corresponding to the storage area 101 based on a position of the storage area 101.

The counting circuit 402 is connected to the processing circuit 401, and configured to receive the initial grab signal gEn, perform counting based on a clock signal Clk, and output the sub-grab signal gxEn corresponding to the storage area when a counting value equals the preset value.

The integration circuit 403 is configured to generate the grab enable signal GEn based on the sub-grab signal gxEn corresponding to the storage area to which a WL in an on-state belongs.

Further, in some examples, the delay generation circuit 104 further includes a pre-storing circuit 404. The pre-storing circuit 404 is connected to the processing circuit 401, and configured to pre-store the preset value corresponding to each storage area 101.

It is to be noted that, in this embodiment, the clock signal Clk used by the counting circuit 402 is an internal clock signal of the memory. In other embodiments, the clock signal used by the counting circuit may be acquired according to an external clock signal.

In this embodiment, the data to be written into each storage area is adjusted by generating the sub-grab signal gxEn of each storage area 101 according to the initial grab signal gEn, and the data is grabbed by the read-write control circuit 103 at different moments, so as to achieve the uniformity of the time intervals between the time of receiving the data on the global data line YIO and the time of receiving the column selection signal YS for different storage areas, so that the time interval between the time of receiving data transmitted by the global data line YIO and the time of receiving the column selection signal YS for each storage area meets the preset range. Therefore, the time intervals between reception of the column selection signal YS and the completion of data transmission on the global data line YIO in different storage areas are unified, thereby optimizing the tCCD of the DRAM.

All circuits involved in this embodiment are logical circuits. In actual application, a logical circuit may be a physical circuit, a part of the physical circuit, or a combination of a plurality of physical circuits. In addition, in order to highlight the innovative part of the disclosure, this embodiment does not introduce circuits that are not closely related to resolving the technical problem proposed by the disclosure, but this does not mean that there are no other circuits in this embodiment.

It is to be noted that, the features disclosed in the data writing circuit provided in the above embodiments may be combined arbitrarily without conflict to obtain a new data writing circuit embodiment.

Another embodiment of the disclosure provides a data writing method, to unify the time interval between the column selection signal and the completion of data transmission on the global data line in different storage areas, so as to optimize the tCCD of the DRAM.

Figure 8:
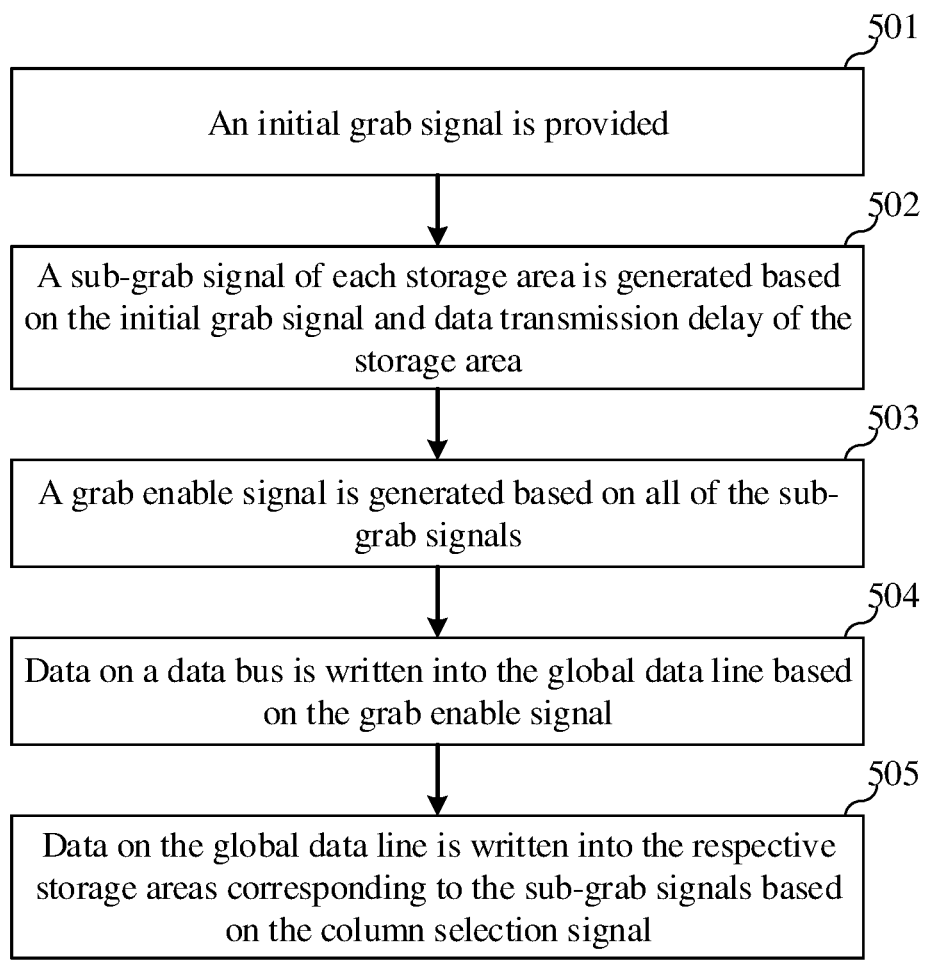
FIG. 8 is a schematic flowchart of a data writing method according to an embodiment of the disclosure.

FIG. 8 is a schematic flowchart of a data writing method according to an embodiment. The data writing method provided in this embodiment is further described in detail below with reference to the drawings. Details are shown as follows.

Referring to FIG. 8, the data writing method includes the following operations.

At S501, an initial grab signal is provided.

At S502, a sub-grab signal of each storage area is generated based on the initial grab signal and data transmission delay of the storage area.

Specifically, the sub-grab signal of each storage area is generated based on the initial grab signal and the data transmission delay of the storage area, to enable a time interval between the time of receiving data transmitted by a global data line and the time of receiving a column selection signal for each storage area to meet a preset range.

Data transmission delay corresponding to the storage area close to the column decoding circuit is less than data transmission delay corresponding to the storage area away from the column decoding circuit.

In some embodiments, a value of the data transmission delay is greater than or equal to transmission delay of data on the global data line YIO between the storage area 101 and the read-write control circuit 103.

Further, in some embodiments, the value of the data transmission delay is equal to the transmission delay of data on the global data line YIO between the storage area 101 and the read-write control circuit 103.

In an example, the operation that the sub-grab signal corresponding to each storage area is generated based on the initial grab signal and data transmission delay of a global data line between the storage area and a read-write control circuit includes the following. The data transmission delay of the global data line between each storage area and the read-write control circuit is acquired. The sub-grab signal corresponding to each storage area is generated based on the initial grab signal and the data transmission delay.

In an example, the operation that the sub-grab signal corresponding to each storage area is generated based on the initial grab signal and data transmission delay of a global data line between the storage area and a read-write control circuit includes the following. An active WL address is acquired. A storage area to which the active WL address belongs is acquired, and a preset value corresponding to the storage area is acquired based on a position of the storage area. Counting is performed based on the initial grab signal and a clock signal, and the sub-grab signal of the storage area corresponding to the preset value is output when a counting value equals the preset value.

For the storage areas 0 to 35, it may be learned from FIG. 1 that, for the column selection signal YS sent by the column decoding circuit 102, the time that the storage area close to the column decoding circuit 102 receives the column selection signal YS is prior to the time that the storage area away from the column decoding circuit 102 receives the column selection signal YS. Referring to FIG. 1, assuming that the column selection signal YS is provided at time T, the storage area 0 receives the column selection signal YS at time T0, and time delay that the storage areas 1 to 35 receive the column selection signal YS is T0+ΔT0 (for different storage areas 101, ΔT0 is different).

It may be learned from the above, the data transmission delay corresponding to the storage area close to the column decoding circuit 102 is less than the data transmission delay corresponding to the storage area away from the column decoding circuit 102. Referring to FIG. 1, assuming that the read-write control circuit 103 grabs the data at time 0, the storage area 0 receives the data on the global data line YIO at time T1, and the time delay that the storage areas 1 to 35 receive the data on the global data line YIO is T1−ΔT1 (for different storage areas 101, ΔT1 is different).

Ideally (there are no delay of the column selection signal YS and no data transmission delay of the global data line), the time interval between the time that the storage area receives the data of the global data line YIO and the time that the storage area receives the column selection signal YS is T. However, actually, the time interval between the time that the storage area receives the data on the global data line YIO and the time that the storage area receives the column selection signal YS is (T0+ΔT0)−(T1−ΔT1). The data to be written into each storage area is adjusted by generating the sub-grab signal gxEn of each storage area 101 according to the initial grab signal gEn, and the data is grabbed by the read-write control circuit 103 at different moments, so as to achieve the uniformity of the time intervals between the time of receiving the data on the global data line YIO and the time of receiving the column selection signal YS by different storage areas, so that the time interval between the time of receiving data transmitted by the global data line YIO and the time of receiving the column selection signal YS for each storage area 101 meets the preset range.

Specifically, for the storage areas 0 to 35, referring to FIG. 2, the storage area 101 close to the column decoding circuit 102 may rapidly receive the column selection signal YS, that is, T0+ΔT0 is relatively small. For the storage area 101, it is required to slowly receive the data on the global data line YIO, that is, T1−ΔT1 is relatively large. In this case, the time interval between the time that the storage area 101 receives the data on the global data line YIO and the time that the storage area 101 receives the column selection signal YS is small, that is, (T0+ΔT0)−(T1−ΔT1) is small. Referring to FIG. 3, the time that the storage area 101 receives the data on the global data line YIO is shortened by controlling the read-write control circuit 103 to grab data in advance, that is, T1−ΔT1 is reduced, so that the time interval between the time of receiving the data on the global data line YIO and the time of receiving the column selection signal YS by the storage area 101 is increased.

Continuously referring to FIG. 2, the storage area 101 away from the column decoding circuit 102 needs to slowly receive the column selection signal YS, that is, T0+ΔT0 is relatively large. The storage area 101 may rapidly receive the data of the global data line YIO, that is, T1−ΔT1 is relatively small. In this case, the time interval between the time that the storage area 101 receives the data of the global data line YIO and the time that the storage area 101 receives the column selection signal YS is large, that is, (T0+ΔT0)−(T1−ΔT1) is small. Referring to FIG. 3, the time that the storage area 101 receives the data of the global data line YIO is prolonged by performing delay control on the read-write control circuit 103 to grab data, that is, T1−ΔT1 is increased, so that the time interval between the time that the storage area 101 receives the data of the global data line YIO and the time that the storage area 101 receives the column selection signal YS is increased.

For the storage areas 36 to 71, based on the discussion mentioned above, the time delay that the storage area 36 to the storage area 71 receive the column selection signal YS is T0+ΔT0 (for different storage areas 101, ΔT0 is different), and the delay that the data of the storage area 36 to the storage area 71 is transmitted to the read-write control circuit 103 by using the global data line is T1−ΔT1 (for different storage areas 101, ΔT1 is different).

The storage area 101 close to the column decoding circuit 102 may rapidly receive the data of the global data line YIO, that is, T1−ΔT1 is relatively small; and the storage area 101 may rapidly receive the column selection signal YS, that is, T0+ΔT0 is relatively small. The storage area 101 away from the column decoding circuit 102 needs to slowly receive the data of the global data line YIO, that is, T1−ΔT1 is relatively large; and the storage area 101 needs to slowly receive the column selection signal YS, that is, T0+ΔT0 is relatively large. However, due to the high RC load of the column selection signal YS, there is still a difference in the time interval (T0+ΔT0)−(T1−ΔT1) for data writing when different storage areas 101 receive the data of the global data line YIO, and if T0+ΔT0 is larger, (T0+ΔT0)−(T1−ΔT1) is larger. That is, for the storage area 101 away from the column decoding circuit 102, it is required to perform delay control on the read-write control circuit 103 to grab data, so that the time that the storage area 101 receives the data of the global data line YIO is prolonged.

Each sub-grab signal gxEn is used for configuring the corresponding storage area 101 to complete data writing. If the data is continuously written, that is, according to the storage area required to be written, the active level in the corresponding sub-grab signal gxEn is integrated on a same signal, to generate the grab enable signal GEn. The grab enable signal GEn is configured to instruct the corresponding storage area to complete continuous data writing.

At S503, a grab enable signal is generated based on all of the sub-grab signals.

Specifically, an active level of each sub-grab signal is integrated on a same signal, to generate the grab enable signal; or an active level common to parts of the sub-grab signals is integrated on a secondary grab signal, and an active level of each secondary grab signal is integrated on a same signal, to generate the grab enable signal.

At S504, data on a data bus is written into the global data line based on the grab enable signal.

At S505, data on the global data line is written into the respective storage areas corresponding to the sub-grab signals based on the column selection signal.

In this embodiment, the data to be written into each storage area is adjusted by generating the sub-grab signal of each storage area according to the initial grab signal, and the data is grabbed by the read-write control circuit at different moments, so as to achieve the uniformity of the time intervals between the time of receiving the data on the global data line and the time of receiving the column selection signal for different storage areas, so that the time interval between the time of receiving data transmitted by the global data line and the time of receiving the column selection signal for each storage area meets the preset range. Therefore, the time intervals between the column selection signal and the completion of data transmission on the global data line in different storage areas are unified, thereby optimizing the tCCD of the DRAM.

Since the above embodiments correspond to this embodiment, this embodiment may be implemented in cooperation with the above embodiments. The relevant technical details mentioned in the above embodiments are still valid in this embodiment. The technical effects that can be achieved in the above embodiments may also be implemented in this embodiment, and details are not described herein again for reducing repetitions. Correspondingly, the relevant technical details mentioned in this embodiment may also be applied to the above embodiments.

Another embodiment of the disclosure further provides a memory, including a plurality of storage areas, a read-write control circuit and a column decoding circuit. Data is transmitted to a global data line by using the above data writing circuit. Each storage area is connected to the global data line, and based on a column selection signal, the data transmitted on the global data line is received and stored by using the column decoding circuit, so that the time intervals between the column selection signal YS and the completion of data transmission on the global data line YIO in different storage areas are unified, thereby optimizing the tCCD of the DRAM.

In some embodiments, the memory is a DRAM chip, and the internal storage of the DRAM chip conforms to a DDR2 memory specification.

In some embodiments, the memory is the DRAM chip, and the internal storage of the DRAM chip conforms to a DDR3 memory specification.

In some embodiments, the memory is the DRAM chip, and the internal storage of the DRAM chip conforms to a DDR4 memory specification.

In some embodiments, the memory is the DRAM chip, and the internal storage of the DRAM chip conforms to a DDR5 memory specification.

Those of ordinary skill in the art may understand that the above embodiments are specific embodiments for realizing the disclosure, and in practical application, various changes may be made in form and details without departing from the spirit and the scope of the disclosure.

INDUSTRIAL APPLICABILITY

In the embodiments of the disclosure, the data writing circuit includes a delay generation circuit. The delay generation circuit is configured to generate a sub-grab signal of each storage area based on an initial grab signal and a data transmission delay of the storage area, and generate a grab enable signal based on all of the sub-grab signals. The data transmission delay corresponding to the storage area close to the column decoding circuit is less than the data transmission delay corresponding to the storage area away from the column decoding circuit. The time interval between a time of receiving data transmitted by a global data line and a time of receiving a column selection signal for each storage area meets the preset range. The read-write control circuit is configured to write data on a data bus into the global data line based on the grab enable signal. The global data line is configured to transmit the data to the storage area through the column decoding circuit based on the column selection signal. In this way, the data to be written into each storage area is adjusted by generating the sub-grab signal of each storage area according to the initial grab signal, and the data is grabbed by the read-write control circuit at different moments, so as to achieve the uniformity of the time intervals between the time of receiving the data on the global data line and the time of receiving the column selection signal for different storage areas, so that the time interval between the time of receiving data transmitted by the global data line and the time of receiving the column selection signal for each storage area meets the preset range. Therefore, the time intervals between the column selection signal and the completion of data transmission on the global data line in different storage areas are unified, thereby optimizing the tCCD of the DRAM.

The invention claimed is:

1. A data writing circuit, applicable to a memory, the memory comprising a read-write control circuit, a column decoding circuit, and a plurality of storage areas, and the data writing circuit comprising:
   a delay generation circuit, configured to generate a sub-grab signal of each storage area based on an initial grab signal and data transmission delay of the storage area, and generate a grab enable signal based on all of the sub-grab signals, wherein
   data transmission delay corresponding to the storage area close to the column decoding circuit is less than data transmission delay corresponding to the storage area away from the column decoding circuit;
   a time interval between a time of receiving data transmitted by a global data line and a time of receiving a column selection signal for each storage area meets a preset range;
   the read-write control circuit is configured to write data on a data bus into the global data line based on the grab enable signal; and
   the global data line is configured to transmit the data to the storage area through the column decoding circuit based on the column selection signal.

2. The data writing circuit of claim 1, wherein the delay generation circuit comprises:
   a delay circuit, configured to generate the sub-grab signal corresponding to each storage area; and an integration circuit, configured to generate the grab enable signal based on a sub-grab signal corresponding to a storage area to which a Word Line (WL) in an on-state belongs.

3. The data writing circuit of claim 2, wherein the delay circuit comprises a plurality of delay subcircuits;

the plurality of delay subcircuits are in series connection with each other;

in the plurality of delay subcircuits connected in series, an input end of a first-stage delay subcircuit is configured to receive the initial grab signal, a connection line between two adjacent delay subcircuits and an output end of a last-stage delay subcircuit are configured to output sub-grab signals corresponding to different storage areas; and different sub-grab signals have different data transmission delay.

4. The data writing circuit of claim 3, wherein an even number of inverters are arranged in each delay subcircuit, and the number of inverters in parts of the delay subcircuits are different.

5. The data writing circuit of claim 3, wherein an even number of inverters are arranged in each delay subcircuit, and the number of inverters in each delay subcircuit are same.

6. The data writing circuit of claim 2, wherein the integration circuit comprises:

a plurality of primary NAND gates, each primary NAND gate corresponding to one storage area, wherein one input end of each NAND gate is configured to receive an area indication signal of a corresponding storage area, and the other input end is configured to receive a sub-grab signal of the corresponding storage area;

the area indication signal is configured to indicate the storage area to which the WL in the on-state belongs; and output ends of the plurality of primary NAND gates are connected to a same output OR gate, and the output OR gate is configured to output the grab enable signal.

7. The data writing circuit of claim 6, wherein the integration circuit further comprises:

a plurality of secondary NAND gates, wherein a number of the secondary NAND gates is less than a number of the primary NAND gates, and each secondary NAND gate is connected to at least two primary NAND gates; and output ends of the plurality of secondary NAND gates are connected to the same output OR gate.

8. The data writing circuit of claim 1, wherein the delay generation circuit comprises:

a processing circuit, configured to acquire a storage area to which an active Word Line (WL) address belongs according to the active WL address, and acquire a preset value corresponding to the storage area based on a position of the storage area;

a counting circuit, connected to the processing circuit, and configured to receive the initial grab signal, perform counting based on a clock signal, and output a sub-grab signal corresponding to the storage area when a counting value equals the preset value; and an integration circuit, configured to generate the grab enable signal based on a sub-grab signal corresponding to a storage area to which a WL in an on-state belongs.

9. The data writing circuit of claim 8, wherein the delay generation circuit further comprises:

a pre-storing circuit, connected to the processing circuit, and configured to pre-store the preset value corresponding to each storage area.

10. The data writing circuit of claim 8, wherein the clock signal is an internal clock signal of the memory.

11. The data writing circuit of claim 1, wherein the time interval between the time of receiving data transmitted by the global data line and the time of receiving the column selection signal by each storage area is the same.

12. The data writing circuit of claim 1, wherein a value of the data transmission delay equals transmission delay of data on the global data line between the storage area and the read-write control circuit.

13. A data writing method, applicable to the data writing circuit of claim 1, and comprising:

providing an initial grab signal;

generating a sub-grab signal of each storage area based on an initial grab signal and data transmission delay of the storage area, to enable a time interval between a time of receiving data transmitted by a global data line and a time of receiving a column selection signal by each storage area to meet a preset range, wherein data transmission delay corresponding to the storage area close to the column decoding circuit is less than data transmission delay corresponding to the storage area away from the column decoding circuit;

generating a grab enable signal based on all of the sub-grab signals;

writing data on a data bus into the global data line based on the grab enable signal; and writing data on the global data line into respective storage areas corresponding to the sub-grab signals based on the column selection signal.

14. The data writing method of claim 13, wherein generating the grab enable signal based on all of the sub-grab signals comprises:

integrating an active level of each sub-grab signal on a same signal, to generate the grab enable signal; or integrating an active level common to parts of the sub-grab signals on a secondary grab signal, and integrating an active level of each secondary grab signal on a same signal, to generate the grab enable signal.

15. The data writing method of claim 13, wherein generating the sub-grab signal of each storage area based on the initial grab signal and data transmission delay of the storage area and comprises:

acquiring the data transmission delay of the global data line between each storage area and the read-write control circuit; and generating the sub-grab signal corresponding to each storage area based on the initial grab signal and the data transmission delay.

16. The data writing method of claim 13, wherein generating the sub-grab signal of each storage area based on the initial grab signal and data transmission delay of the storage area comprises:

acquiring an active Word Line (WL) address;

acquiring a storage area to which the active WL address belongs, and acquiring a preset value corresponding to the storage area based on a position of the storage area; and performing counting based on the initial grab signal and a clock signal, and outputting the sub-grab signal of the storage area corresponding to the preset value when a counting value equals the preset value.

17. The data writing method of claim 13, wherein a value of the data transmission delay equals transmission delay of data on the global data line between the storage area and the read-write control circuit.

18. A memory, comprising:
- a read-write control circuit, a column decoding circuit, and a plurality of storage areas;
- wherein data is transmitted to a global data line by using a data writing circuit, the data writing circuit comprising: a delay generation circuit, configured to generate a sub-grab signal of each storage area based on an initial grab signal and data transmission delay of the storage area, and generate a grab enable signal based on all of the sub-grab signals, wherein
- data transmission delay corresponding to the storage area close to the column decoding circuit is less than data transmission delay corresponding to the storage area away from the column decoding circuit;
- a time interval between a time of receiving data transmitted by a global data line and a time of receiving a column selection signal for each storage area meets a preset range;
- the read-write control circuit is configured to write data on a data bus into the global data line based on the grab enable signal; and
- the global data line is configured to transmit the data to the storage area through the column decoding circuit based on the column selection signal; and
- each storage area is connected to the global data line, and the data transmitted on the global data line is received and stored by the column decoding circuit based on a column selection signal.

19. The memory of claim 18, wherein the memory is a Dynamic Random Access Memory (DRAM) chip.

* * * * *